(12) United States Patent
Liu et al.

(10) Patent No.: US 11,345,813 B2
(45) Date of Patent: May 31, 2022

(54) RESIN COMPOSITION, PRE-PREG, METAL-CLAD LAMINATE, AND PRINTED CIRCUIT BOARD USING THE SAME

(71) Applicant: TAIWAN UNION TECHNOLOGY CORPORATION, Chupei (TW)

(72) Inventors: Shur-Fen Liu, Chupei (TW); Chin-Hsien Hung, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 502 days.

(21) Appl. No.: 16/428,609

(22) Filed: May 31, 2019

(65) Prior Publication Data

US 2019/0367727 A1    Dec. 5, 2019

Related U.S. Application Data

(60) Provisional application No. 62/680,290, filed on Jun. 4, 2018.

(30) Foreign Application Priority Data

May 8, 2019   (TW) .................. 108115829

(51) Int. Cl.

| | | |
|---|---|---|
| C08L 71/12 | (2006.01) | |
| B32B 15/085 | (2006.01) | |
| B32B 25/14 | (2006.01) | |
| B32B 27/30 | (2006.01) | |
| H05K 1/03 | (2006.01) | |
| C08K 5/5397 | (2006.01) | |
| B32B 15/06 | (2006.01) | |
| C08L 9/02 | (2006.01) | |
| C08L 9/06 | (2006.01) | |
| C08K 5/3415 | (2006.01) | |
| C08K 5/52 | (2006.01) | |
| C08L 55/02 | (2006.01) | |
| C08K 5/00 | (2006.01) | |
| C08K 3/013 | (2018.01) | |
| C08J 5/24 | (2006.01) | |
| B32B 15/082 | (2006.01) | |

(52) U.S. Cl.
CPC .............. *C08L 71/12* (2013.01); *B32B 15/06* (2013.01); *B32B 15/082* (2013.01); *B32B 15/085* (2013.01); *B32B 25/14* (2013.01); *B32B 27/302* (2013.01); *B32B 27/308* (2013.01); *C08J 5/24* (2013.01); *C08K 3/013* (2018.01); *C08K 5/0066* (2013.01); *C08K 5/3415* (2013.01); *C08K 5/52* (2013.01); *C08K 5/5397* (2013.01); *C08L 9/02* (2013.01); *C08L 9/06* (2013.01); *C08L 55/02* (2013.01); *H05K 1/0373* (2013.01); *B32B 2457/08* (2013.01); *C08L 2201/02* (2013.01); *C08L 2203/206* (2013.01); *C08L 2312/00* (2013.01)

(58) Field of Classification Search
CPC ..... B32B 27/285; B32B 25/14; B32B 27/308; B32B 15/14; B32B 15/18; B32B 5/024; B32B 15/085; B32B 27/302; B32B 15/06; B32B 15/08; B32B 5/022; B32B 15/082; B32B 15/12; B32B 2307/748; B32B 2262/105; B32B 2264/0257; B32B 2262/101; B32B 2264/107; B32B 2264/102; B32B 2457/08; B32B 2307/3065; B32B 2260/046; B32B 2264/101; B32B 2264/108; B32B 2260/028; B32B 2307/204; B32B 2260/021; B32B 2264/12; B32B 2264/104; B32B 2457/204; B32B 2250/02; B32B 2307/734; C08K 5/52; C08K 5/49; C08K 3/013; C08K 5/5397; C08K 5/3415; C08K 5/0066; C08K 5/3492; C08J 5/24; C08J 2371/12; C08L 9/06; C08L 55/02; C08L 9/02; C08L 51/08; C08L 71/12; C08L 2201/02; C08L 2203/206; C08L 2312/00; C08F 290/062; C08F 230/02; H05K 1/0373
See application file for complete search history.

(56) References Cited

U.S. PATENT DOCUMENTS

| | | | |
|---|---|---|---|
| 5,218,030 | A | 6/1993 | Katayose et al. |
| 5,352,745 | A | 10/1994 | Katayose et al. |
| 6,352,782 | B2 | 3/2002 | Yeager et al. |
| 6,995,195 | B2 | 2/2006 | Ishii et al. |
| 9,809,690 | B2 | 11/2017 | Koes |
| 2016/0280913 | A1 | 9/2016 | Liu et al. |

FOREIGN PATENT DOCUMENTS

TW    I387588    3/2013

*Primary Examiner* — Angela C Scott
(74) *Attorney, Agent, or Firm* — Christensen, Fonder, Dardi & Herbert PLLC

(57) ABSTRACT

A resin composition is provided. The resin composition comprises:
(A) a polyphenylene ether resin which has an unsaturated functional group; and
(B) a first cross-linking agent represented by the following formula (I):

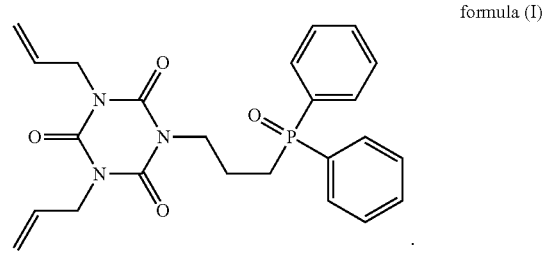

formula (I)

14 Claims, No Drawings

RESIN COMPOSITION, PRE-PREG, METAL-CLAD LAMINATE, AND PRINTED CIRCUIT BOARD USING THE SAME

CLAIM FOR PRIORITY

This application claims the benefit of U.S. Provisional Patent Application No. 62/680,290 filed on Jun. 4, 2018, and claims priority to Taiwan Patent Application No. 108115829, filed on May 8, 2019, the subject matters of which are incorporated herein in their entirety by reference.

BACKGROUND OF THE INVENTION

Field of the Invention

The present invention provides a resin composition, especially a halogen-free flame-retardant resin composition which contains a diphenyl phosphine oxide modified diallyl isocyanurate as a cross-linking agent. The resin composition of the present invention can be used in combination with reinforcing materials to constitute a composite material or prepreg. Furthermore, it can be used as a metal foil adhesive to prepare a resin-coated copper (RCC), a metal-clad laminate, a printed circuit board (PCB) and so on.

Descriptions of the Related Art

Recently, in the field of electronic telecommunications, electronic products have been designed to operate at higher frequencies and speeds due to the increasing amount of data transmission, and polyphenylene ether resin-based laminates are the most popular laminates in terms of high frequency and speedy transmissions. Furthermore, due to growing environmental awareness, halogen-containing flame retardants used in electronic materials are gradually being replaced by halogen-free flame retardants, such as metal hydroxides, nitrogen-containing compounds, phosphorus-containing compounds, etc.

Usually, polyphenylene ether resin is used together with triallyl isocyanurate (TAIC) or triallyl cyanurate (TAC) monomer compound as a cross-linking agent to prepare a polyphenylene ether resin-based laminate. However, TAIC and TAC could evaporate from the resin composition during the preparing process due to their low boiling point (about 145° C., which is lower than the processing temperature of a prepreg), which will change the formulation of the resin composition and thus affect the properties of the prepared electronic material.

U.S. Pat. No. 9,809,690 provides a solution for the above problem, wherein TAIC or TAC was polymerized into polymer particles and then added in form of filler into a resin composition, thereby solving the evaporation problem of the monomers of TAIC or TAC during the preparing process of laminates. However, in order to provide sufficient cross-linking effect, the amount of TAIC or TAC polymer particle fillers would not be minor, making the proportion of the filler component including the TAIC or TAC polymer particle fillers and other general filler (e.g., $SiO_2$) overly high and thus causing problem. For example, the dynamic viscosity (DV) of the resin composition would be too high such that the fluidity during compressing operation is poor, and as a result, the appearance of the manufactured laminate is bad and the adhesion between the dielectric layer and copper foil of the laminate is insufficient.

In view of the above, there is a need for a technical solution that can solve the evaporation problem of TAIC or TAC monomer without causing the aforementioned disadvantages.

SUMMARY OF THE INVENTION

The present invention provides a resin composition, which comprises a polyphenylene ether resin having an unsaturated functional group, and a diphenyl phosphine oxide (DPPO) modified diallyl isocyanurate (also refers to hereinafter as "DPPO-DAIC") as a cross-linking agent. The resin composition of the present invention can solve the evaporation problem of "triallyl isocyanurate (TAIC)" cross-linking agent. In addition, the resin composition of the present invention has excellent fluidity and therefore particularly suitable for the resin composition that including a high amount of fillers; and the metal clad laminate obtained from the resin composition has excellent appearance flatness and adhesion strength to copper foils.

Therefore, an object of the present invention is to provide a resin composition, which comprises:

(A) a polyphenylene ether resin which has an unsaturated functional group; and (B) a first cross-linking agent represented by the following formula (I):

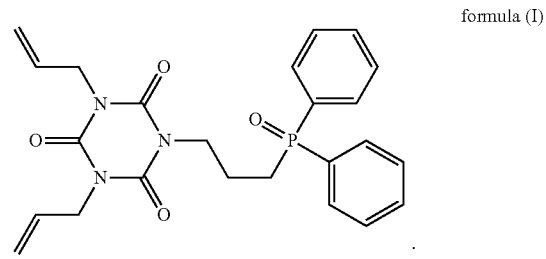

formula (I)

In some embodiments of the present invention, the polyphenylene ether resin (A) is represented by the following formula (II):

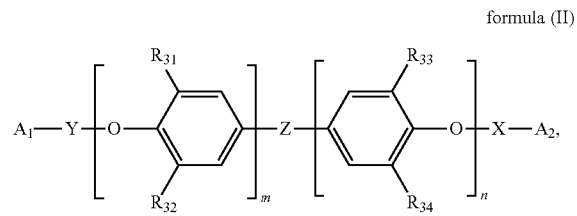

formula (II)

wherein, $R_{31}$, $R_{32}$, $R_{33}$ and $R_{34}$ are independently H, or a substituted or unsubstituted C1-C5 alkyl;

m and n are independently an integer from 0 to 100, with the proviso that m and n are not 0 at the same time;

Z is absent, or aryl, —O—,

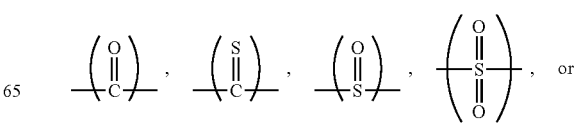

or

-continued

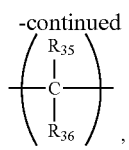

wherein $R_{35}$ and $R_{36}$ are independently H or a C1-C12 alkyl; X and Y are independently absent, or carbonyl or an alkenyl-containing group; and $A_1$ and $A_2$ are independently

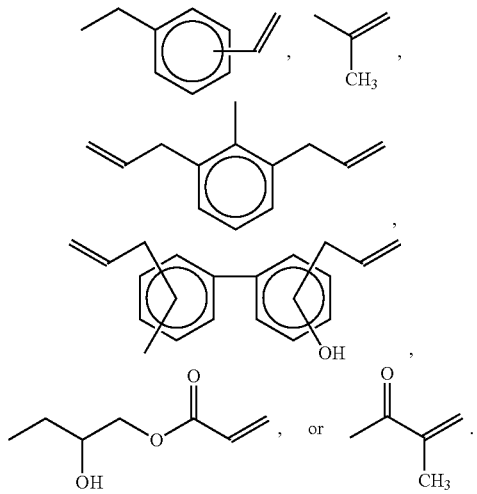

In some embodiments of the present invention, the weight ratio of the polyphenylene ether resin (A) to the first cross-linking agent (B) is from 13:1 to 1:1.

In some embodiments of the present invention, the resin composition further comprises a vinyl-containing elastomer. The vinyl-containing elastomer can be selected from, for example, the group consisting of polybutadiene, styrene-butadiene (SB) copolymer, styrene-butadiene-styrene (SBS) block copolymer, polyisoprene, styrene-isoprene copolymer, styrene-isoprene-styrene (SIS) block copolymer, acrylonitrile-butadiene copolymer, acrylonitrile-butadiene-styrene block copolymer, and combinations thereof.

In some embodiments of the present invention, the resin composition further comprises a phosphorus-containing additive flame retardant selected from the group consisting of a phosphinate salt, a polyphosphate salt, a phosphonium salt, a phosphate ester, a phosphazene, a phosphite ester, a phosphine oxide, and combinations thereof.

In some embodiments of the present invention, the resin composition further comprises a filler selected from the group consisting of silica, aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof.

In some embodiments of the present invention, the resin composition further comprises a second cross-linking agent (C) selected from the group consisting of a polyfunctional allylic compound, a polyfunctional acrylate, a polyfunctional acrylamide, a polyfunctional styrenic compound, a bismaleimide compound, and combinations thereof.

Another objective of the present invention is to provide a prepreg, which is prepared by impregnating a substrate with the aforementioned resin composition or by coating the aforementioned resin composition onto a substrate, and drying the impregnated or coated substrate.

Yet another objective of the present invention is to provide a metal-clad laminate, which is prepared by laminating the aforementioned prepreg and a metal foil, or by coating the aforementioned resin composition onto a metal foil and drying the coated metal foil.

Yet another objective of the present invention is to provide a printed circuit board, which is prepared from the aforementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing constituents in a solution, mixture or composition in the specification, the amount of each constituent is calculated based on the dry weight, i.e., regardless of the weight of the solvent.

Unless it is additionally explained, the expressions "first," "second," or the like recited in the specification (especially in the claims) are only used to distinguish different elements or components. They do not have special meanings and are not intend to indicate sequential order.

The efficacy of the present invention resides in that the resin composition of the present invention uses a diphenyl phosphine oxide modified diallyl isocyanurate (DPPO-DAIC) as a cross-linking agent to solve the evaporation problem of triallyl isocyanurate (TAIC) cross-linking agent and enable a resin composition containing filler in a high amount to have an excellent fluidity so that the metal clad laminate prepared therefrom can have excellent flatness. The technical features and efficacy of the present invention are described below via some embodiments.

1. Resin Composition

The resin composition of the present invention comprises (A) a polyphenylene ether resin having an unsaturated functional group and (B) a first cross-linking agent represented by formula (I) as essential components, and other optional components that may be used depending on the need. Detailed description for the components of the resin composition are as follows.

1.1. Polyphenylene Ether Resin (A)

As used herein, a polyphenylene ether resin refers to a resin having at least a repeating unit

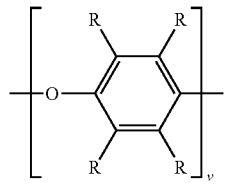

in the main chain and having an unsaturated functional group at the terminal, wherein Rs are independently H or a C1-C5 alkyl, and v is an integer ranging from 1 to 100. The unsaturated functional group refers to a group capable of carrying out addition polymerization with other components having an unsaturated functional group, and the addition polymerization reaction can be initiated by light or heat in the presence of a polymerization initiator. Examples of the unsaturated functional group include but are not limited to vinyl, vinyl benzyl, allyl, acryloyl, acrylate and methacrylate. Examples of the polyphenylene ether resin having an unsaturated functional group include but are not limited to a vinyl-containing polyphenylene ether resin, an allyl-containing polyphenylene ether resin, a vinyl benzyl-containing polyphenylene ether resin, an acryloyl-containing polyphenylene ether resin, an acrylate-containing polyphenylene ether resin and a methacrylate-containing polyphenylene ether resin. Each of the polyphenylene ether resin having an unsaturated functional group can either be used alone or in any combination.

The method for preparing the polyphenylene ether resin having an unsaturated functional group is not the technical feature of the present invention, and persons having ordinary skill in the art can conduct the method based on the disclosure of the present invention and ordinary skill.

The related methods for preparing the polyphenylene ether resin having an unsaturated functional group are described in, for example, U.S. Pat. No. 6,995,195 B2 for vinyl-containing polyphenylene ether resins, U.S. Pat. No. 5,218,030 A for allyl-containing polyphenylene ether resins, U.S. Pat. No. 5,352,745 A for methacrylate-containing polyphenylene ether resins, U.S. Pat. No. 6,352,782 B2, and US 2016/0280913 A1, all of which are incorporated herein in their entireties by reference.

In some embodiments of the present invention, the polyphenylene ether resin (A) is represented by the following formula (II):

formula (II)

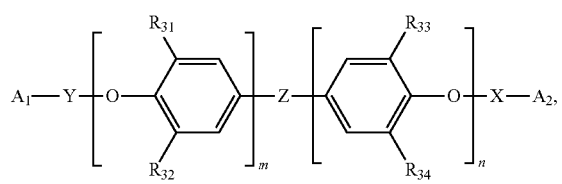

In formula (II), $R_{31}$, $R_{32}$, $R_{33}$ and $R_{34}$ are independently H, or a substituted or unsubstituted C1-C5 alkyl; m and n are independently an integer from 0 to 100, with the proviso that m and n are not 0 at the same time; Z is absent, or aryl, —O—,

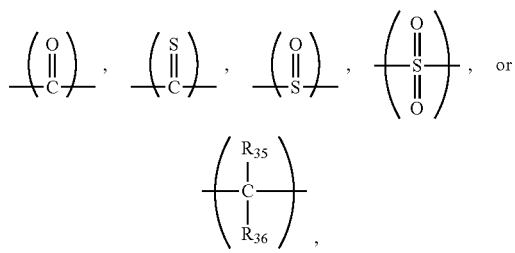

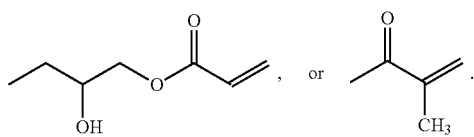

wherein $R_{35}$ and $R_{36}$ are independently H or a C1-C12 alkyl; X and Y are independently absent, or carbonyl or an alkenyl-containing group; and $A_1$ and $A_2$ are independently

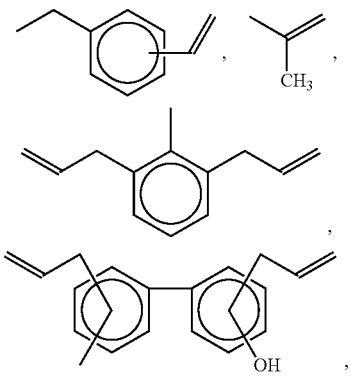

In the resin composition of the present invention, the polyphenylene ether resin (A) having an unsaturated functional group may have a weight average molecular weight (Mw) from 1000 to 50,000, preferably from 1000 to 10,000, and more preferably from 1000 to 5000. If the Mw of the polyphenylene ether resin is above the aforementioned range, the properties of the resin composition, such as fluidity, solubility, etc., may degrade, which makes it difficult for subsequent processing. On the other hand, if the Mw of the polyphenylene ether resin is below the aforementioned range, the dielectric properties and thermal stability of the resin composition may degrade.

1.2 First Cross-Linking Agent (B)

As used herein, a cross-linking agent refers to a component having an unsaturated functional group and being capable of undergoing crosslinking reaction with a polyphenylene ether resin to form a stereo network structure, wherein the unsaturated functional group is as defined above. In the resin composition of the present invention, a first cross-linking agent represented by the following formula (I) is used as an necessary component:

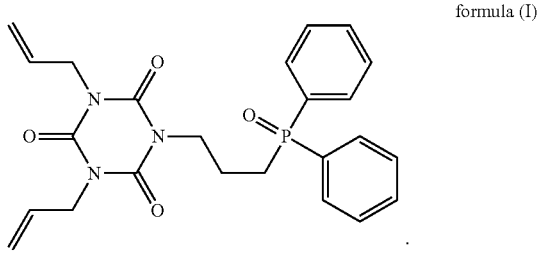 [SMILES: C=CCn1c(=O)n(CC=C)c(=O)n(CCCP(=O)(c2ccccc2)c2ccccc2)c1=O]

formula (I)

The cross-linking agent represented by formula (I) is a diphenyl phosphine oxide (DPPO) modified diallyl isocyanurate (DAIC), and the synthesize method thereof is provided in the following Examples. DPPO-DAIC does not have the evaporation problem of conventional TAIC or TAC where the volatility of the monomers is too high. Without the evaporation, the constitution of the resin composition would not be changed during the preparing process of a laminate.

DPPO-DAIC can also provide the function of a flame retardant and can be properly added into the resin composition to provide sufficient flame retardance to the electronic material made from the resin composition. Furthermore, since DPPO-DAIC is a reactive flame retardant and therefore does not have the defects of phase separation or migration to surface of the material that is generally occurred in the case of additive flame retardants.

In the resin composition of the present invention, the amount of the first cross-linking agent (B) is not particularly limited. However, in order to sufficiently have the characteristic of the polyphenylene ether resin and provide sufficient cross-linking effect, the weight ratio of the polyphenylene ether resin (A) to the first cross-linking agent (B) is preferably from 13:1 to 1:1, such as 12:1, 11:1, 10:1, 9:1, 8:1, 7:1, 6:1, 5:1, 4:1, 3:1, or 2:1.

1.3. Other Optional Components

The resin composition of the present invention may optionally further comprise other optional components, such as vinyl-containing elastomers, phosphorus-containing additive flame retardants, fillers and a second cross-linking agent, and additives well-known to persons having ordinary skill in the art, as illustrated below, to adaptively improve the workability of the resin composition during preparing or the physicochemical properties of the electronic material prepared from the resin composition. The additives well-known to persons having ordinary skill in the art include but are not limited to polymerization initiators and curing accelerators.

1.3.1. Vinyl-Containing Elastomer

As used herein, an elastomer refers to a polymer having viscoelasticity which imparts toughness to an electronic material. In some embodiments of the present invention, the resin composition further includes a vinyl-containing elastomer which can undergo a crosslinking reaction with other components having an unsaturated functional group, such that the prepared electronic material has better toughness and lower Dk and Df values.

In general, a vinyl-containing elastomer is formed by polymerization of monomers having carbon-carbon unsaturated bonds, and a pendant vinyl group is present on the main chain of the polymer or a branch or a terminal group thereof, wherein the pendant vinyl content usually expressed as a percentage is preferably greater than 10%, and more preferably greater than 50%.

The vinyl-containing elastomer may be, for example, a homopolymer polymerized from conjugated-diene monomers, and a copolymer copolymerized from a conjugated-diene monomers and other monomers. The Mw of the vinyl-containing elastomer may be from 200 to 100,000, preferably from 1000 to 5000, and more preferably from 1000 to 3000. Examples of the conjugated-diene monomers include butadiene and isoprene, and examples of other monomers include styrene and maleic anhydride.

Examples of the vinyl-containing elastomer include but are not limited to polybutadiene, styrene-butadiene (SB) copolymer, styrene-butadiene-styrene (SBS) block copolymer, polyisoprene, styrene-isoprene copolymer, styrene-isoprene-styrene (SIS) block copolymer, acrylonitrile-butadiene copolymer, and acrylonitrile-butadiene-styrene block copolymer. Each of the vinyl-containing elastomers can either be used alone or in any combination.

Commercially available vinyl-containing elastomers include Ricon 100, Ricon 181, Ricon 184, Ricon 104H, Ricon 250, Ricon 257, Ricon 157, Ricon 130, Ricon 130MA and Ricon 184MA available from Cray Valley company, B3000 available from Nippon Soda company, and Kraton DX1300 available from Shell Oil company.

In the resin composition of the present invention, the weight ratio of the polyphenylene ether resin (A) having an unsaturated functional group to the vinyl-containing elastomer is preferably from 9:1 to 1:1, such as 8:1, 7:1, 6:1, 5:1, 4:1, 3:1, or 2:1. If the weight ratio of the vinyl-containing elastomer is too high (for example, higher than the aforementioned preferred range), the heat resistance and dimensional stability of the prepared electronic material may deteriorate. If the weight ratio of the vinyl-containing elastomer is too low (for example, lower than the aforementioned preferred range), the vinyl-containing elastomer may not be able to provide the desired toughening effect, resulting in the deterioration of the physical properties of the prepared electronic material.

1.3.2. Phosphorus-Containing Additive Flame Retardant

The resin composition of the present invention may optionally further comprise phosphorus-containing additive flame retardants, i.e. phosphorus-containing compounds that do not have a reactive unsaturated functional group. In order to meet the halogen-free requirements of the resin composition of the present invention, the phosphorus-containing additive flame retardant should be a halogen-free flame retardant. Examples of the phosphorus-containing additive flame retardant include but are not limited to phosphinate, polyphosphate, phosphonium salt, phosphate ester, phosphazene, phosphite ester, phosphine oxide, and combinations thereof.

Examples of the phosphinate include but are not limited to aluminum dialkylphosphinate, aluminum tris(diethylphosphinate), aluminum tris(methylethylphosphinate), aluminum tris(diphenylphosphinate), zinc bis(diethylphosphinate), zinc bis(methylethylphosphinate), zinc bis(diphenylphosphinate), titanyl bis(diethylphosphinate), titanyl bis(methylethylphosphinate), and titanyl bis(diphenylphosphinate). One commercially available phosphinate is OP-935 available from CLARIANT company.

Examples of the polyphosphate include but are not limited to melamine polyphosphate, melam polyphosphate, and melem polyphosphate. One commercially available polyphosphate is Melapur 200, available from BASF company.

An example of the phosphonium salt is, but is not limited to tetraphenylphosphonium tetraphenylborate. Examples of the phosphate ester include but are not limited to a condensed phosphate ester compound, and a cyclic phosphate ester compound. Examples of the condensed phosphate ester compound include but are not limited to triphenyl phosphate, tricresyl phosphate, xylenyl-diphenyl phosphate, cresyl-diphenyl phosphate, resorcinol bis-xylenylphosphate (RXP), resorcinol bis-diphenylphosphate (RDP), and 9,10-dihydro-9-oxa-10-phosphaphenanthrene-10-oxide (DOPO). Commercially available phosphate esters include PX-200 and PX-202 available from Daihachi Chemical Industry company, and CG-686 and CG-RDP available from Chembridge company.

The phosphazene may be a cyclic phosphazene compound and a linear phosphazene compound. Commercially available phosphazenes include BP-PZ, SPB-100, and SPH-100, each is available from Otsuka Chemical company. Examples of the phosphite ester include but are not limited to trimethylphosphite and triethylphosphite. Examples of the phosphine oxide include but are not limited to tris-(4-methoxyphenyl) phosphine oxide, triphenyl phosphine oxide, diphenyl phosphine oxide, and derivatives thereof. Commercially available phosphine oxides include PQ-60, available from Chin Yee Chemical Industry company, and BPO-13 and BPE-3, available from Katayama Chemical Industries company.

1.3.3. Filler

The resin composition of the present invention may optionally further comprise a filler to improve the mechanical strength, thermal conductivity and dimensional stability of the prepared electronic materials. Examples of the suitable fillers include but are not limited to silica (for example, spherical silica, fused silica, non-fused silica, porous silica, or hollow silica), aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, and nanosized inorganic powder. The aforementioned fillers can either be used alone or in any combination, and may be surface-modified with a coupling agent, such as silane coupling agent, before being added into the resin composition to increase the compatibility between the filler and other components of the resin composition, and the workability of the resin composition. In the appended examples, the filler is strontium titanate, titanium dioxide or silica.

1.3.4. Second Cross-Linking Agent

The resin composition of the present invention may optionally further comprise other cross-linking agent having an unsaturated functional group, which also refers to herein as "second cross-linking agent". The second cross-linking agent may be any conventional component that has an unsaturated functional group and therefore can undergo crosslinking reaction with the polyphenylene ether resin (A). However, in consideration of the volatility of the materials, the second cross-linking agent preferably excludes triallyl isocyanurate (TAIC) and triallyl cyanurate (TAC).

Examples of the second cross-linking agent include but are not limited to a polyfunctional allyl-based compound, a polyfunctional acrylate, a polyfunctional styrene-based compound, a bismaleimide compound, and a polyfunctional acrylamide. Each of the aforementioned polyfunctional cross-linking agent can either be used alone or in any combination.

A polyfunctional allyl-based compound refers to a compound containing at least two allyl groups. Examples of the polyfunctional allyl-based compound include but are not limited to diallyl phthalate, diallyl isophthalate, triallyl trimellitate, triallyl mesate, and prepolymers thereof.

A polyfunctional acrylate refers to a compound containing at least two acrylate groups. Examples of the polyfunctional acrylate include but are not limited to trimethylolpropane tri(meth)acrylate, 1,6-hexanediol di(meth)acrylate, ethylene glycol di(meth)acrylate, propylene glycol di(meth)acrylate, 1,3-butanediol di(meth)acrylate, 1,4-butanediol di(meth)acrylate, cyclohexane dimethanol di(meth)acrylate, diethylene glycol di(meth)acrylate, triethylene glycol di(meth)acrylate, and prepolymers thereof.

A polyfunctional styrene-based compound refers to a compound having at least two alkenyl groups attached to any aromatic ring. Examples of the polyfunctional styrene-based compound include but are not limited to 1,3-divinylbenzene, 1,4-divinylbenzene, trivinylbenzene, 1,3-diisopropenylbenzene, 1,4-diisopropenylbenzene, 1,2-bis(p-vinylphenyl)ethane, 1,2-bis(m-vinylphenyl)ethane, 1-(p-vinylphenyl)-2-(m-vinylphenyl)-ethane, 1,4-bis(p-vinylphenylethyl)benzene, 1,4-bis(m-vinylphenylethyl)benzene, 1,3-bis(p-vinylphenylethyl)benzene, 1,3-bis(m-vinylphenylethyl)benzene, 1-(p-vinylphenylethyl)-4-(m-vinylphenylethyl) benzene, 1-(p-vinylphenylethyl)-3-(m-vinylphenylethyl)benzene, and prepolymers thereof.

A bismaleimide compound refers to a compound having at least two of maleimide functional groups. Specific examples of the bismaleimide compound include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexylmethane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimido-diphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide and N,N'-methylene bis(3-chloro-p-phenylene)bismaleimide.

1.3.5. Polymerization Initiator

The resin composition of the present invention may optionally further comprise polymerization initiators to assist with inducing polymerization. Examples of the polymerization initiators include but are not limited to azobisisobutyronitrile, azobis(2-isopropyl)butyronitrile, azobisisoheptonitrile, dibenzoyl peroxide, acetylisobutyryl peroxide, diacetyl peroxide, 2,4-dichlorobenzoyl peroxide, 2-dimethylbenzoyl peroxide, lauroyl peroxide, diisopropyl peroxydicarbonate, bis(3,5,5-trimethylhexanoyl) peroxide, cyclohexanone peroxide, methyl ethyl ketone peroxide, dicyclohexylpropyl peroxydicarbonate, dicyclohexyl peroxydicarbonate, bis(4-tert-butylcyclohexyl) peroxydicarbonate, bis(2-ethylhexyl) peroxydicarbonate, bis(2-phenylethoxy) peroxydicarbonate, dihexadecyl peroxydicarbonate, tert-butyl peroxybenzoate, tert-butyl peroxyphenylacetate, peracetic acid, tert-butyl peroxypivalate, tert-hexyl peroxypivalate, cumyl peroxyneodecanoate, tert-butyl hydroperoxide, cumene hydroperoxide, p-menthane hydroperoxide, ditert-butyl peroxide, hydrogen peroxide, ammonium persulfate, potassium persulfate, peroxide-alkyl metal, and oxy-alkyl metal. Each of the polymerization initiators can either be used alone or in any combination.

1.4. Proportions of the Resin Composition

In the resin composition of the present invention, the amount of each essential components and optional components can be adjusted depending on the needs, except that the weight ratio of the polyphenylene ether resin (A) to the first cross-linking agent (B) is preferably from 13:1 to 1:1, such as 12:1, 11:1, 10:1, 9:1, 8:1, 7:1, 6:1, 5:1, 4:1, 3:1, or 2:1. In some embodiments of the present invention, the resin composition of the present invention comprises 5 parts by weight to 70 parts by weight of the polyphenylene ether resin (A), 5 parts by weight to 80 parts by weight of first cross-linking agent (B), 3 parts by weight to 65 parts by weight of second cross-linking agent, 0 part by weight to 50 parts by weight of vinyl-containing elastomer, 5 parts by weight to 80 parts by weight of filler, and 0 part by weight to 70 parts by weight of a phosphorus-containing additive flame retardant. However, the present invention is not limited thereto.

1.5. Preparation of Resin Composition

The resin composition of the present invention may be prepared for subsequent applications by evenly mixing the polyphenylene ether resin (A), the first cross-linking agent (B) represented by formula (I), and other optional components through a stirrer, and dissolving or dispersing the obtained mixture into a solvent. The solvent here can be any inert solvent that can dissolve or disperse the components of the resin composition of the present invention but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP). The solvents can either be used alone or in combination. The amount of the solvent is not particularly limited as long as the components of the resin composition can be evenly dissolved or dispersed therein.

2. Prepreg

The present invention also provides a prepreg prepared from the aforementioned resin composition, wherein the prepreg is prepared by impregnating a substrate with the aforementioned resin composition or by coating the aforementioned resin composition onto a substrate and drying the impregnated or coated substrate. The method for preparing the prepreg is not particularly limited, and can be easily accomplished by persons having ordinary skill in the art based on the disclosure of the present specification and their ordinary skill. Specifically, the method for impregnating or coating resin compositions include but are not limited to impregnating, roll coating, die coating, bar coating, and spraying. The impregnated or coated substrate can be dried at a temperature of 80° C. to 180° C. for 1 to 20 minutes to obtain a semi-cured (B-stage) prepreg.

The ordinary substrates comprise glass fiber reinforcing materials (e.g., glass-fiber woven fabrics, glass papers, glass mats, etc.), kraft papers, short fiber cotton papers, nature fiber cloths, and organic fiber cloths. Examples of the substrate include but are not limited to woven fabrics, non-woven fabrics, glass roving cloths, glass cloths, chopped glass fibers, hollow glass fibers, glass mats, glass surfacing mats, non-woven glass fabrics, and ceramic fiber fabrics. Examples of the raw material that can be used to form the substrate include but are not limited to E-glass fiber, NE-glass fiber, S-glass fiber, L-glass fiber, T-glass fiber, D-glass fiber, quartz, aramid, and liquid crystal polymer. Considering the dielectric properties of the prepared electronic material, it is preferred to use a substrate having a low Df value, such as a substrate composed of E-glass fiber, NE-glass fiber, S-glass fiber, and L-glass fiber.

In some embodiments of the present invention, a 2116 glass fiber cloth is used as the substrate. The substrate is heated and dried at 175° C. for 2 to 15 minutes (B-stage) to provide a semi-cured prepreg.

3. Metal-Clad Laminate and Printed Circuit Board

The present invention also provides a metal-clad laminate prepared from the aforementioned prepreg, which comprises a dielectric layer and a metal layer. The metal-clad laminate can be prepared by laminating the aforementioned prepreg and a metal foil, or by coating the resin composition onto a metal foil and then drying the coated metal foil, wherein the dielectric layer is provided by the aforementioned prepreg. In the case of the preparation of the metal-clad laminate by using the prepreg, the metal-clad laminate can be prepared by superimposing a plurality of the aforementioned prepregs, superimposing a metal foil (such as a copper foil) on at least one external surface of the dielectric layer composed of the superimposed prepregs to provide a superimposed object, and then performing a hot-pressing operation onto the superimposed object to obtain the metal-clad laminate.

Furthermore, the aforementioned metal-clad laminate can form a printed circuit board by further patterning the external metal foil thereof.

4. Examples 4.1. Testing Methods

The present invention is further illustrated by the embodiments hereinafter, wherein the testing instruments and methods are as follows:

[Dielectric Constant (Dk) and Dissipation Factor (Df) Measurements]

The dielectric constant (Dk) and dissipation factor (Df) of the metal-clad laminate are measured according to IPC-TM-650 2.5.5.13 under an operating frequency of 10 GHz. The resin content (RC) of the prepreg in the metal-clad laminate is 54%.

[Glass Transition Temperature (Tg) Test]

The glass transition temperature (Tg) of the dielectric layer is measured by using a dynamic mechanical analyzer (DMA), wherein the dielectric layer is as defined above. The instrument used is a viscoelasticity spectrometer which is DMS100 available from Seiko Instruments. The measuring method is as follows: using bending modules, setting the frequency at 10 Hz and the heating rate at 5° C./min, and measuring the dynamic viscoelasticity during heating from room temperature to 280° C. The temperature at which the maximum tanδ is measured is Tg.

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties. The ranking for the flame retardance level is V0>V1>V2.

[Dimensional Stability Test]

Four prepregs are laminated to provide a specimen. The dimensional stability test is carried out according to IPC- TM-650 2.4.24.5 by using a thermal mechanical analyzer (TMA) to measure the coefficient of thermal expansion (CTE) α1 and the rate of change of the coefficient of thermal expansion in the Z-axis direction (total z-CTE) of the specimen to be tested at temperatures below Tg. The α1 is measured in the temperature range from 50° C. to 120° C., and the unit thereof is ppm/° C. The total z-CTE is measured in the temperature range from 50° C. to 260° C., and the unit thereof is %.

[Test of Adhesion Strength to Copper Foil]

The adhesion strength of the metal foil to the laminated prepreg is tested by vertically peeling a clad copper foil with a width of ⅛ inch from the surface of the laminated prepreg, and the adhesion strength is expressed as the force required to do so. The unit of the adhesion strength is pounds per inch (lbf/in).

[Evaluation of the Appearance of Copper Clad Laminate (CCL)]

The metal clad laminate was etched to remove metal copper foil, and then the surface of the laminate after the removal of copper foil was evaluated under visual inspection. If no crack, stain, or detachment of resin is found, it indicates that the resin composition has good fluidity such that the laminate prepared therefrom has good appearance, and the test result is recorded as "O". If crack, stain, or detachment of resin is found, it indicates that the resin composition has poor fluidity such that the laminate manufactured therefrom has poor appearance, and the test result is recorded as "X".

4.2. List of Raw Materials Used in Examples and Comparative Examples:

TABLE 1

Raw Material List

| Raw Materials | Description and Source |
|---|---|
| SA9000 | Polyphenylene ether resin having an unsaturated functional group, available from Saudi Basic Industry Corporation (SABIC) |
| OPE-2st | Polyphenylene ether resin having an unsaturated functional group, available from Mitsubishi Gas Chemical Company |
| DPPO-DAIC | Synthesized first cross-linking agent represented by formula (I) |
| DCP | Cross-linking agent, dicumyl peroxide |
| DVB | Cross-linking agent, divinylbenzene |
| Ricon 181 | Butadiene-styrene copolymer, vinyl-containing elastomer and available from Cray Valley Company |
| Ricon 100 | Butadiene-styrene copolymer, vinyl-containing elastomer and available from Cray Valley Company |
| BP-PZ | Phosphorus-containing flame retardant, available from Otsuka Chemical Company |
| PQ-60 | Phosphorus-containing flame retardant, available from Chin Yee Chemical Industry Company |
| OP-935 | Phosphorus-containing flame retardant, available from Clariant Company |
| PX-200 | Phosphorus-containing flame retardant, available from Daihachi Chemical Industry Company |
| $SrTiO_3$ | Inorganic filler, 218, available from Ferro Company |
| $TiO_2$ | Inorganic filler, HTO2, available from Superrite Company |
| $SiO_2$ | Inorganic filler, 525, available from Sibelco Company |
| Perbutyl P | Polymerization initiator, available from Nippon Oil & Fats Company |

4.3. Preparation of Resin Composition 4.3.1. Synthesis of First Cross-Linking Agent Represented by Formula (I)

Firstly, 67 grams of diphenyl phosphine oxide (DPPO) were completely melted at 90° C. for 1 hour and under nitrogen atmosphere. After that, 83 grams of triallyl isocyanurate (TAIC) were slowly added thereinto, and the obtained mixture was heated to 135° C. to react for 2 hr and then cooled to room temperature. The compound represented by formula (1) was obtained. The compound has a melt point of 30° C., a phosphorus content of 6.9%, and a nitrogen content of 9.3%.

4.3.2. Resin Composition

The resin compositions of Examples 1 to 12 and Comparative Examples 1 to 3 were prepared according to the proportions shown in Tables 2-1, Table 2-2, and Table 3.

TABLE 2-1

Proportions of the resin compositions of Examples 1 to 6

| Units: Parts by weight | | Example 1 | Example 2 | Example 3 | Example 4 | Example 5 | Example 6 |
|---|---|---|---|---|---|---|---|
| Polyphenylene ether resin (A) | SA9000 | 60 | 60 | 60 | 0 | 60 | 60 |
| | OPE-2st | 0 | 0 | 0 | 60 | 0 | 0 |
| First cross-linking agent (B) | DPPO-DAIC | 25 | 25 | 25 | 25 | 25 | 25 |

TABLE 2-1-continued

Proportions of the resin compositions of Examples 1 to 6

| Units: Parts by weight | | Example 1 | Example 2 | Example 3 | Example 4 | Example 5 | Example 6 |
|---|---|---|---|---|---|---|---|
| Other cross-linking agent | DCP | 0 | 0 | 0 | 0 | 0 | 0 |
| | DVB | 0 | 0 | 0 | 0 | 0 | 0 |
| Vinyl-containing elastomer | Ricon 181 | 15 | 15 | 15 | 0 | 15 | 0 |
| | Ricon 100 | 0 | 0 | 0 | 15 | 0 | 15 |
| Phosphorus-containing flame retardant | BP-PZ | 15 | 15 | 15 | 15 | 0 | 0 |
| | PQ-60 | 0 | 0 | 0 | 0 | 20 | 0 |
| | OP-935 | 0 | 0 | 0 | 0 | 0 | 15 |
| | PX-200 | 0 | 0 | 0 | 0 | 0 | 0 |
| Inorganic filler | $SrTiO_3$ | 200 | 0 | 0 | 200 | 0 | 0 |
| | $TiO_2$ | 0 | 200 | 0 | 0 | 200 | 200 |
| | $SiO_2$ | 0 | 0 | 200 | 0 | 0 | 0 |
| Polymerization initiator | Perbutyl P | 2 | 2 | 2 | 2 | 2 | 2 |

TABLE 2-2

Proportions of the resin compositions of Examples 7 to 12

| Units: Parts by weight | | Example 7 | Example 8 | Example 9 | Example 10 | Example 11 | Example 12 |
|---|---|---|---|---|---|---|---|
| Polyphenylene ether resin (A) | SA9000 | 60 | 60 | 60 | 60 | 50 | 60 |
| | OPE-2st | 0 | 0 | 0 | 0 | 0 | 0 |
| First cross-linking agent (B) | DPPO-DAIC | 25 | 25 | 25 | 25 | 40 | 5 |
| Other cross-linking agent | DCP | 0 | 0 | 0 | 0 | 0 | 0 |
| | DVB | 0 | 0 | 0 | 0 | 0 | 0 |
| Vinyl-containing elastomer | Ricon 181 | 15 | 15 | 15 | 15 | 10 | 35 |
| | Ricon 100 | 0 | 0 | 0 | 0 | 0 | 0 |
| Phosphorus-containing flame retardant | BP-PZ | 0 | 15 | 15 | 15 | 15 | 20 |
| | PQ-60 | 0 | 0 | 0 | 0 | 0 | 0 |
| | OP-935 | 0 | 0 | 0 | 0 | 0 | 0 |
| | PX-200 | 20 | 0 | 0 | 0 | 0 | 0 |
| Inorganic filler | $SrTiO_3$ | 0 | 0 | 0 | 0 | 200 | 200 |
| | $TiO_2$ | 200 | 300 | 100 | 0 | 0 | 0 |
| | $SiO_2$ | 0 | 0 | 0 | 100 | 0 | 0 |
| Polymerization initiator | Perbutyl P | 2 | 2 | 2 | 2 | 2 | 2 |

TABLE 3

Proportions of the resin compositions of Comparative Examples 1 to 3

| Units: Parts by weight | | Comparative Example 1 | Comparative Example 2 | Comparative Example 3 |
|---|---|---|---|---|
| Polyphenylene ether resin (A) | SA9000 | 60 | 60 | 0 |
| | OPE-2st | 0 | 0 | 0 |
| First cross-linking agent (B) | DPPO-DAIC | 0 | 0 | 30 |
| Other cross-linking agent | DCP | 25 | 0 | 0 |
| | DVB | 0 | 25 | 0 |
| Vinyl-containing elastomer | Ricon 181 | 15 | 15 | 0 |
| | Ricon 100 | 0 | 0 | 70 |
| Phosphorus-containing flame retardant | BP-PZ | 20 | 20 | 15 |
| | PQ-60 | 0 | 0 | 0 |
| | OP-935 | 0 | 0 | 0 |
| | PX-200 | 0 | 0 | 0 |
| Inorganic filler | $SrTiO_3$ | 0 | 0 | 200 |
| | $TiO_2$ | 200 | 200 | 0 |
| | $SiO_2$ | 0 | 0 | 0 |
| Polymerization initiator | Perbutyl P | 2 | 2 | 0 |

4.4. Preparation and Properties of Metal-Clad Laminate

The metal-clad laminates of Examples 1 to 12 and Comparative Examples 1 to 3 were respectively prepared by using the prepared resin compositions. In detail, one of the resin compositions of Examples 1 to 12 and Comparative Examples 1 to 3 was coated on glass fiber cloths (type: 2116; thickness: 0.08 mm) by a roller at a controlled thickness. The coated glass fiber cloths were then placed in an oven and dried at 175° C. for 2 to 15 minutes to produce prepregs in a half-cured state (B-stage) (the resin content of the prepreg was about 54%). Four pieces of the prepregs were superimposed and two sheets of copper foil (0.5 oz.) were respectively superimposed on both of the two external surfaces of the superimposed prepregs to provide a superimposed object. A hot-pressing operation was performed on each of the prepared objects. The hot-pressing conditions were as follows: heating to about 200° C. to 220° C. at a heating rate of 3.0° C./min, and hot-pressing for 180 minutes under a full pressure of 15 kg/cm² (initial pressure is 8 kg/cm²) at said temperature.

The properties of the prepregs and metal-clad laminates of Examples 1 to 12 and Comparative Examples 1 to 3, including dielectric constant (Dk), dissipation factor (Df), glass transition temperature (Tg), flame retardance, coefficient of thermal expansion α1, the rate of change of the coefficient of thermal expansion in the Z-axis direction (total z-CTE), adhesion strength to copper foil, and evaluation of the appearance of copper clad laminate (CCL), and the results are tabulated in Table 4.

TABLE 4

Properties of the prepregs and the metal-clad laminates of examples and comparative examples

| | | Dielectric constant Dk | Dissipation factor Df | Glass transition temperature Tg | Flame retardance | α1 (ppm/°C.) | total z-CTE (%) | Adhesion strength to copper foil (lbf/in) | Appearance of CCL |
|---|---|---|---|---|---|---|---|---|---|
| Examples | 1 | 8.5 | 0.0051 | 220 | V-0 | 31 | 2.2 | 3.8 | ○ |
| | 2 | 8.1 | 0.0041 | 216 | V-0 | 29 | 2.0 | 3.6 | ○ |
| | 3 | 4.0 | 0.0038 | 223 | V-0 | 26 | 1.9 | 4.0 | ○ |
| | 4 | 8.5 | 0.0053 | 225 | V-0 | 30 | 2.3 | 4.1 | ○ |
| | 5 | 8.0 | 0.0039 | 222 | V-0 | 33 | 2.1 | 3.7 | ○ |
| | 6 | 8.3 | 0.0042 | 227 | V-0 | 28 | 2.0 | 3.5 | ○ |
| | 7 | 8.2 | 0.0038 | 209 | V-1 | 37 | 2.9 | 4.2 | ○ |
| | 8 | 12.4 | 0.0032 | 232 | V-0 | 27 | 1.9 | 3.2 | ○ |
| | 9 | 6.2 | 0.0047 | 212 | V-0 | 31 | 2.4 | 3.7 | ○ |
| | 10 | 3.9 | 0.0042 | 214 | V-0 | 34 | 2.5 | 4.3 | ○ |
| | 11 | 8.3 | 0.0053 | 209 | V-0 | 38 | 2.6 | 3.5 | ○ |
| | 12 | 7.8 | 0.0047 | 198 | V-0 | 42 | 3.0 | 4.2 | ○ |
| Comparative Examples | 1 | 8.4 | 0.0052 | 204 | V-1 | 34 | 2.6 | 3.5 | X |
| | 2 | 8.4 | 0.0050 | 206 | V-1 | 33 | 2.6 | 3.4 | X |
| | 3 | 8.4 | 0.0050 | — | V-0 | 75 | 4.2 | 2.9 | X |

As shown in Table 4, each of the electronic materials prepared from the resin composition of the present invention exhibits satisfactory physicochemical properties and dielectric properties. Particularly, even the filler amount in the resin composition is high, the resin composition of the present invention still has excellent fluidity so that the copper clad laminates prepared therefrom still have excellent appearance. In contrast, the electronic materials prepared by using the resin compositions of the comparative examples do not exhibits satisfactory physicochemical properties and dielectric properties, and in particular, the appearance each of the prepared copper clad laminates are poor.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
   (A) a polyphenylene ether resin which has an unsaturated functional group; and
   (B) a first cross-linking agent represented by the following formula (I):

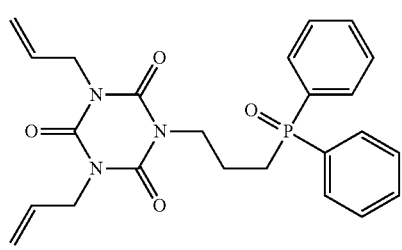

formula (I)

2. The resin composition of claim 1, wherein the polyphenylene ether resin (A) is represented by the following formula (II):

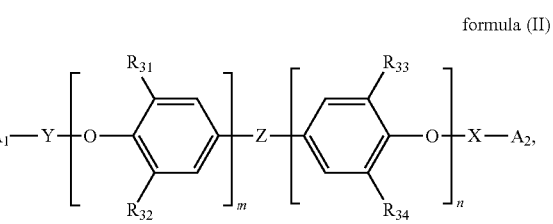

formula (II)

wherein, $R_{31}$, $R_{32}$, $R_{33}$ and $R_{34}$ are independently H, or a substituted or unsubstituted C1-C5 alkyl;

m and n are independently an integer from 0 to 100, with the proviso that m and n are not 0 at the same time;

Z is absent, or aryl, —O—,

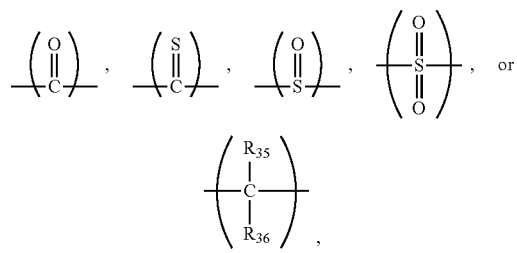

wherein $R_{35}$ and $R_{36}$ are independently H or a C1-C12 alkyl;

X and Y are independently absent, or carbonyl or an alkenyl-containing group; and $A_1$ and $A_2$ are independently

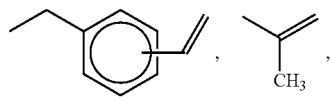

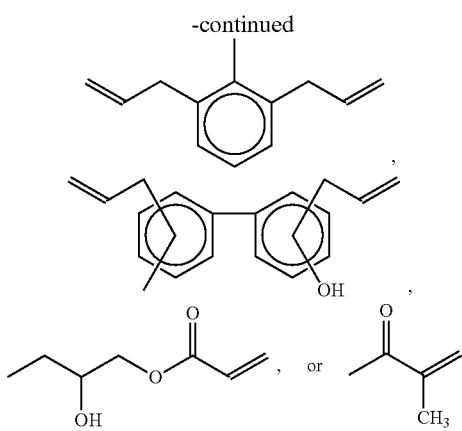

3. The resin composition of claim 1, wherein the weight ratio of the polyphenylene ether resin (A) to the first cross-linking agent (B) is from 13:1 to 1:1.

4. The resin composition of claim 1, further comprising a vinyl-containing elastomer.

5. The resin composition of claim 4, wherein the vinyl-containing elastomer is selected from the group consisting of polybutadiene, styrene-butadiene (SB) copolymer, styrene-butadiene-styrene (SBS) block copolymer, polyisoprene, styrene-isoprene copolymer, styrene-isoprene-styrene (SIS) block copolymer, acrylonitrile-butadiene copolymer, acrylonitrile-butadiene-styrene block copolymer, and combinations thereof.

6. The resin composition of claim 1, further comprising a phosphorus-containing additive flame retardant selected from the group consisting of a phosphinate salt, a polyphosphate salt, a phosphonium salt, a phosphate ester, a phosphazene, a phosphite ester, a phosphine oxide, and combinations thereof.

7. The resin composition of claim 1, further comprising a filler selected from the group consisting of silica, aluminum oxide, aluminum hydroxide, magnesium oxide, magnesium hydroxide, calcium carbonate, talc, clay, aluminum nitride, boron nitride, silicon nitride, silicon aluminum carbide, silicon carbide, sodium carbonate, magnesium carbonate, titanium dioxide, zinc oxide, zirconium oxide, quartz, diamond powder, diamond-like powder, graphite, graphene, potassium titanate, strontium titanate, barium titanate, ceramic fiber, zinc molybdate, ammonium molybdate, zinc borate, calcium phosphate, calcined kaolin, pryan, mica, boehmite, hydrotalcite, carbon nanotube, polytetrafluoroethylene (PTFE) powder, hollow glass bead, nanosized inorganic powder, and combinations thereof.

8. The resin composition of claim 1, further comprising a second cross-linking agent (C) selected from the group consisting of a polyfunctional allylic compound, a polyfunctional acrylate, a polyfunctional acrylamide, a polyfunctional styrenic compound, a bismaleimide compound, and combinations thereof.

9. The resin composition of claim 8, wherein the second cross-linking agent (C) is a bismaleimide compound.

10. A prepreg, which is prepared by impregnating a substrate with the resin composition of claim 1 or by coating the resin composition of claim 1 onto a substrate, and drying the impregnated or coated substrate.

11. A metal-clad laminate, which is prepared by laminating the prepreg of claim 10 and a metal foil.

12. A printed circuit board, which is prepared from the metal-clad laminate of claim 11.

13. A metal-clad laminate, which is prepared by coating the resin composition of claim 1 onto a metal foil and drying the coated metal foil.

14. A printed circuit board, which is prepared from the metal-clad laminate of claim 13.

* * * * *